United States Patent
Popescu

(10) Patent No.: US 9,507,002 B2
(45) Date of Patent: Nov. 29, 2016

(54) METHOD AND APPARATUS FOR PROCESSING MAGNETIC RESONANCE IMAGE DATA

(71) Applicant: Stefan Popescu, Erlangen (DE)

(72) Inventor: Stefan Popescu, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 604 days.

(21) Appl. No.: 13/949,462

(22) Filed: Jul. 24, 2013

(65) Prior Publication Data
US 2014/0028312 A1 Jan. 30, 2014

(30) Foreign Application Priority Data
Jul. 24, 2012 (DE) .......... 10 2012 212 947

(51) Int. Cl.
  *G01R 33/56* (2006.01)
  *G01R 33/565* (2006.01)
  *G01R 33/483* (2006.01)

(52) U.S. Cl.
  CPC ............ *G01R 33/56* (2013.01); *G01R 33/565* (2013.01); *G01R 33/4835* (2013.01)

(58) Field of Classification Search
  CPC . G01R 33/56; G01R 33/565; G01R 33/4835
  See application file for complete search history.

(56) References Cited

U.S. PATENT DOCUMENTS

| 8,022,701 B2 | 9/2011 | Chen et al. | |
| 8,131,048 B2* | 3/2012 | Li ............... | G01R 33/4824 324/307 |
| 2006/0109004 A1* | 5/2006 | Butts ............ | G01R 33/56563 324/307 |

OTHER PUBLICATIONS

Zaitsev et al.; "Point Spread Function Mapping with Parallel Imaging Techniques and High Acceleration Factors: Fast,Robust, and Flexible Method for Echo-Planar Imaging Distortion Correction"; Magnetic Resonance in Medicine; pp:1156-1166 (2004);.
Weaver: "Simultaneous Multislice Acquisition of MR Images," in: Magn.Reson.in Medicine 8, pp. 275-284 (1988).
Lu et al: "SEMAC: Slice Encoding for Metal Artifact Correction in MRI", Magnetic Resonance in Medicine 62, pp. 66-76, (2009).
Cho et al., "Total inhomogeneity correction including chemical shifts and susceptibility by view angle tilting", Med. Phys. 15, pp. 7-11 (1988).
Koch et al., "A Multispectral Three-Dimensional Acquisition Technique for Imaging Near Metal Implants", Magnetic Resonance in Medicine 61: pp. 381-390 (2009).
Beck et al., "A fast iterative shrinkage-thresholding algorithm for linear inverse problems", 2009, Siam J. Imaging Sci. 2, pp. 183-202; (2009).

(Continued)

*Primary Examiner* — G.M. Hyder
(74) *Attorney, Agent, or Firm* — Schiff Hardin LLP

(57) ABSTRACT

In a method, a computer-readable storage medium and a magnetic resonance apparatus for processing image data of the magnetic resonance apparatus, a representation of the degree of image blurring in magnetic resonance data that results from the acquisition of the data with view angle tilting is provided as an input to a processor. The processor calculates a convolution kernel from the input that mathematically relates the degree of blurring to the acquired data. The convolution kernel is applied either to the acquired data before reconstruction of an image therefrom or to the reconstructed image data, so that the resulting image is deblurred.

12 Claims, 8 Drawing Sheets

(56) References Cited

OTHER PUBLICATIONS

Koch et al., "Z-Selective Multi-Spectral 3D Imaging: A MAVRIC-SEMAC Hybrid", ISMRM, p. 139, (2010).
Worters et al.; "Metal Artifact Reduction using Slice Encoding with Shear Correction"; Proc. Intl. Soc. Mag. Reson. Med. 19 p. 292; (2011).
Butts et al.; "Reduction of Blurring in View Angle Tilting MRI"; Magnetic Resonance inMedicine; pp. 418-424; (2005).
Ahn et al.; "View Angle Tilting Echo Planar Imaging for Distortion Correction"; Magnetic Resonance in Medicine; pp. 1211-1219; (2011).
Stefan; "Image restoration by blind deconvolution"; TUM Diplomarbeit; www.caam.rice.edu/~ws6/; pp. 1-52; (2003).

\* cited by examiner

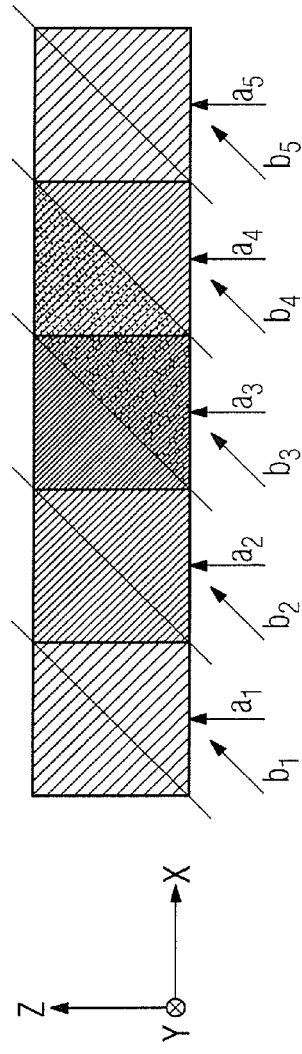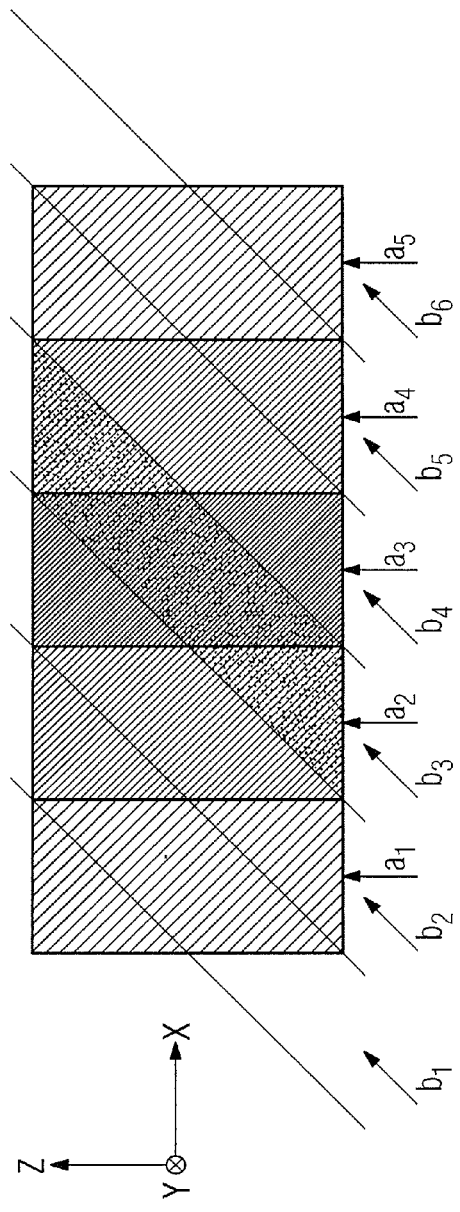

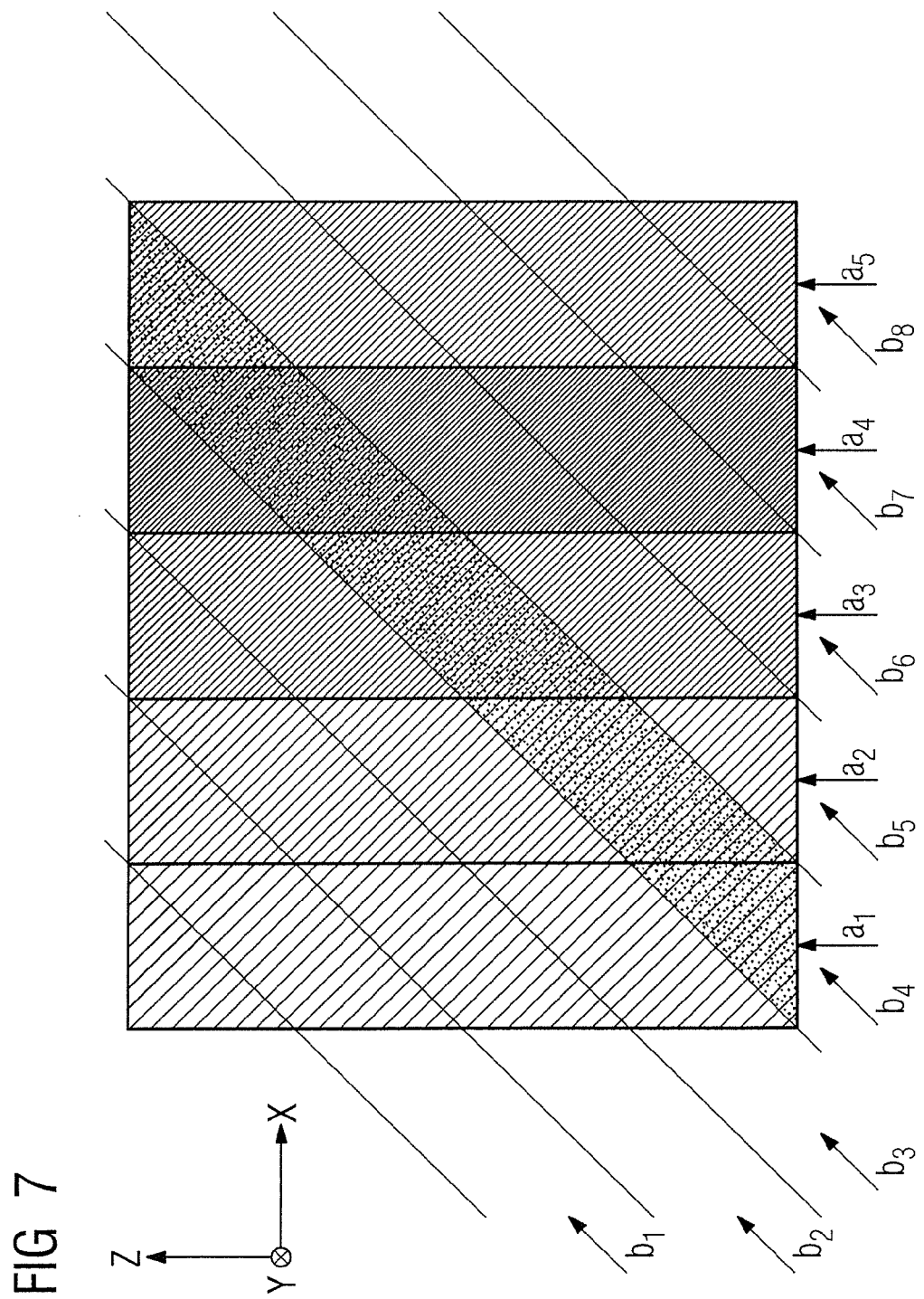

METHOD AND APPARATUS FOR PROCESSING MAGNETIC RESONANCE IMAGE DATA

BACKGROUND OF THE INVENTION

1. Field of the Invention

The present invention concerns a method to improve the sharpness of image data acquired by a magnetic resonance apparatus, as well as a magnetic resonance apparatus and an electronically readable data storage medium to implement such a method.

2. Description of the Prior Art

Magnetic resonance tomography is an examination modality that enables a high-resolution imaging of slices of a person to be examined. Different tissue types (particularly soft tissue) can be imaged with high contrast with this method. The size of the field of view of the magnetic resonance apparatus, the intervals between the slices, the signal-to-noise ratio and the resolution of the acquired images are only a few of the parameters that are significant for a good image quality. If these images are acquired outside of a flip angle—as is the case in the known View Angle Tilting (VAT) method (Cho et al., "Total inhomogeneity correction including chemical shifts and susceptibility by view angle tilting", Med. Phys. 15, 7, 1988), or the Wideband MRI method (John B. Weaver, "Simultaneous Multislice Acquisition of MR Images", Magn. Reson. in Medicine 8, 275-284, 1988)—an unwanted blurring in the underlying exposures thus arises due to this tilting.

A method is known from US 2009/0278538 A1 to reduce blurring in image data generated by magnetic resonance apparatuses by reduction of the field of view of the magnetic resonance apparatus, such as by enlarging the slice interval, reducing the pixel width or increasing the pixel size, which, among other things, results in a reduction of the signal-to-noise ratio or in a reduction of the effective resolution.

SUMMARY OF THE INVENTION

An object of the invention is to provide a correction of such blurring that results due to acquisition of images with view angle tilting.

In the following, the achievement of the object according to the invention is described with reference to the inventive method. Features, advantages or alternative embodiments that are described are likewise applicable to the other aspects of the invention in the form of a magnetic resonance apparatus and a computer-readable data storage medium.

The invention utilizes a model in order to describe the image blurring that results from the acquisition of the image with view angle tilting, and to correct this with the use of a convolution kernel. The system parameters that are used for the imaging, such as the pixel size, the slice thickness or the amplitude of the frequency coding gradients and slice-selection gradients, are not varied.

According to a preferred embodiment of the invention, the degree of image blurring is described with the use of a point spread function. This can be predetermined so that the calculation in real time is omitted.

In a further embodiment, the parameters for the description of the degree of the image blurring are determined from the parameters of the scanning process of the magnetic resonance apparatus. This enables a correction of the blurring in signal space before the actual image reconstruction occurs.

In a preferred embodiment, a projection model is used in the correction of the degree of the image blurring.

According to the invention, it is also possible to determine the parameters for the description of the degree of the image blurring from a phantom measurement. Images of thin tubes (filled with water, for example) are acquired with and without flip angle, and the aliasing kernel is determined from these. Through such a calibration it is possible to take additional boundary conditions (such as inhomogeneities of the slice excitation profile) into account.

In a further embodiment of the method according to the invention, specific regions of the convolution kernel are pre-populated. This allows possible problems as they arise in the acquisition of metallic articles to be avoided. In the typical procedure, an additional gradient there compensates for shifts around the metallic article during the readout process with shifts in the plane of the slice selection, and the complete slice is effectively acquired from one view since a selection is not possible with this compensation method. However, the method according to the invention allows a selective population of the convolution kernel within these regions.

Furthermore, the present invention encompasses a computer-readable data storage medium that can be loaded into a memory of a programmable controller or a computer of a magnetic resonance apparatus. The storage medium is encoded with programming instructions or commands that cause all or various embodiments of the method according to the invention to be executed by the computer, controller or control device of the magnetic resonance apparatus. The programming instructions can be source code that still needs to be compiled and linked or that must only be interpreted, or an executable software code that has only to be loaded into the corresponding computer for execution.

The computer-readable storage medium can be a DVD, a magnetic tape or a USB stick) on which is stored electronically readable control information, in particular software.

The advantages of the storage medium according to the invention as well as of the magnetic resonance apparatus according to the invention essentially correspond to the advantages of the method according to the invention that have been stated in detail above.

BRIEF DESCRIPTION OF THE DRAWINGS

FIG. 5 shows an example for calculation of a convolution kernel.

FIG. 6 shows a second example for the calculation of a convolution kernel.

FIG. 7 shows a third example for the calculation of a convolution kernel.

DESCRIPTION OF THE PREFERRED EMBODIMENTS

Figure 1:
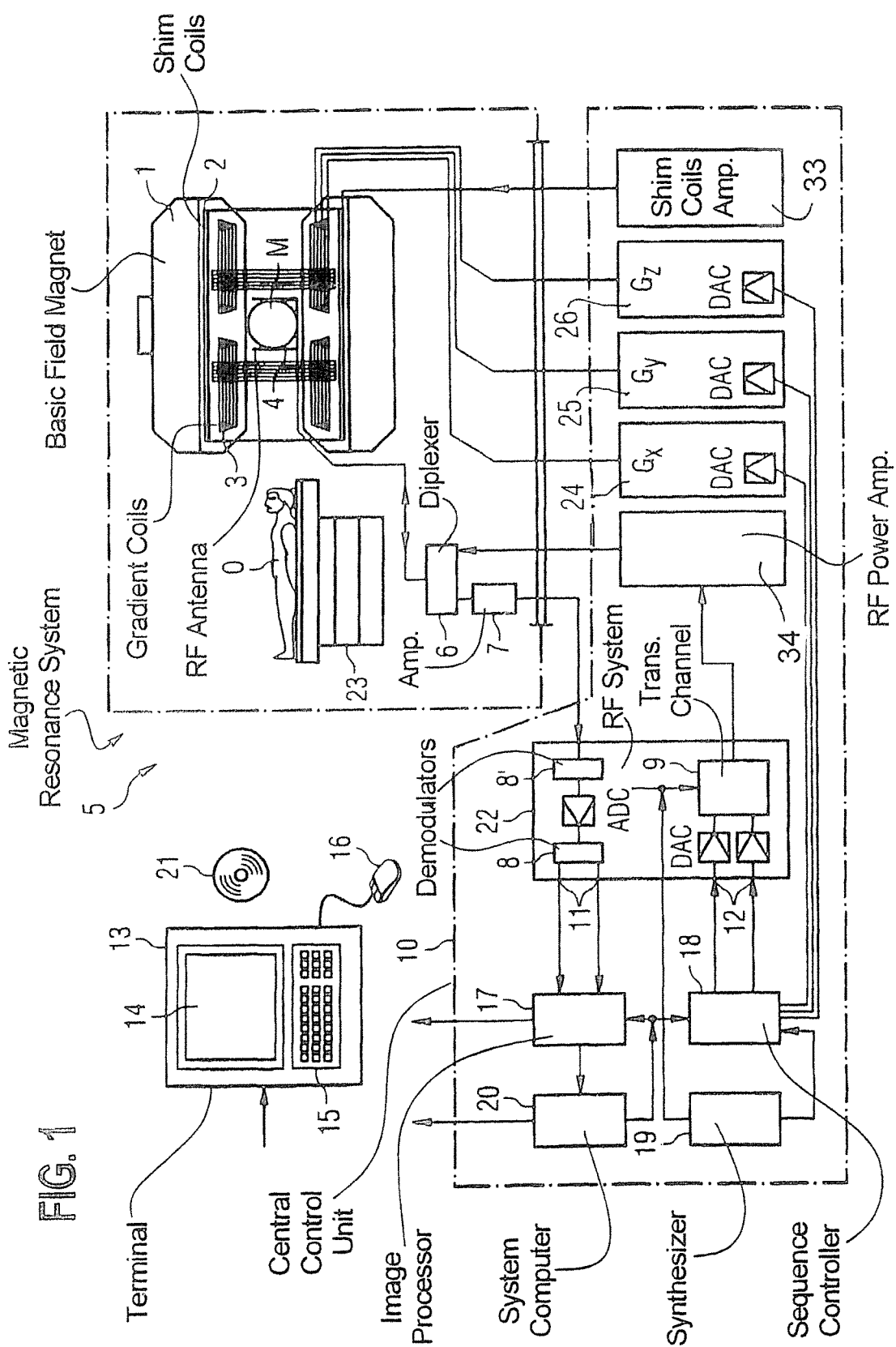
FIG. 1 schematically illustrates a magnetic resonance apparatus according to the invention.

FIG. 1 shows a schematic representation of a magnetic resonance apparatus 9 (a magnetic resonance imaging or magnetic resonance tomography apparatus). A basic field magnet 10 thereby generates a temporally constant, strong magnetic field for polarization or, respectively, alignment of the nuclear spins in an examination region of a subject 11 (for example of a part of a human body that is to be examined) which, lying on a table 12, is slid into the magnetic resonance apparatus 9 for examination. The high homogeneity of the basic magnetic field that is required for the magnetic resonance measurement (data acquisition) is defined in a typically spherical measurement volume M into which the parts of the human body that are to be examined are slid. Shim plates made of ferromagnetic material are mounted at a suitable point to assist with the homogeneity requirements, and in particular to eliminate temporally invariable influences. Temporally variable influences are eliminated by shim coils 13 supplied with appropriate signals from a shim coils amplifier 33.

A cylindrical gradient field system 14 having three sub-windings is inserted into the basic field magnet 10. Each sub-winding is supplied by an amplifier with current to generate a linear (also temporally variable) gradient field in the respective direction of the Cartesian coordinate system. The first sub-winding of the gradient field system 14 generates a gradient $G_x$ in the X-direction; the second sub-winding generates a gradient $G_y$ in the Y-direction; and the third sub-winding generates a gradient $G_z$ in the Z-direction. The amplifier has a digital/analog converter that is controlled by a sequence controller 15 for accurately-timed generation of gradient pulses.

At least one radio-frequency (RF) antenna 16 is located within the gradient field system 14. This radio-frequency antenna 16 converts the radio-frequency pulses emitted by a radio-frequency power amplifier 34 into an alternating magnetic field for excitation of the nuclei and alignment of the nuclear spins of the subject 11 to be examined or of the region of the subject 11 that is to be examined. Each radio-frequency antenna 16 has one or more RF transmission coils and multiple RF reception coils or, respectively, RF reception antennas in the form of an annular (preferably linear or matrix-shaped) arrangement of component coils. The alternating field emanating from the precessing nuclear spins—i.e. normally the magnetic resonance echo signals caused by a pulse sequence composed of one or more radio-frequency pulses and one or more gradient pulses—is also converted by the RF reception coils of the respective radio-frequency antenna 16 into a voltage (measurement signal) that is supplied via an amplifier 17 to a radio-frequency reception channel of a radio-frequency system 19. The radio-frequency system 19 furthermore has a transmission channel 20 in which the radio-frequency pulses are generated for the excitation of the nuclear magnetic resonance. The respective radio-frequency pulses are digitally represented in the sequence controller 15 as a series of complex numbers based on a pulse sequence provided by the apparatus computer 21. This number series is supplied as real part and imaginary part via respective inputs 22 to a digital/analog converter DAC into the radio-frequency system 19, and from this to a transmission channel 20. In the transmission channel 20, the pulse sequences are modulated on a radio-frequency carrier signal whose base frequency corresponds to the reservoir frequency of the nuclear spins in the measurement volume.

The switching from transmission operation to reception operation takes place via a transmission/reception diplexer 23. The RF transmission coils of the radio-frequency antenna 16 radiate the radio-frequency pulses to excite the nuclear spins into the measurement volume M, and resulting echo signals are scanned via the RF reception coils. The acquired magnetic resonance signals are phase-sensitively demodulated to an intermediate frequency in the reception channel (first demodulator 24) of the radio-frequency system 19 and are digitized in the analog/digital converter (ADC). This signal is further demodulated to a frequency of zero. After the digitization in the digital domain, the demodulation to a frequency of zero and the separation into real part and imaginary part occur in a second demodulator 18 that is connected with an output 32.

An MR image is reconstructed by an image computer 25 from the measurement data obtained in such a manner. The administration of the measurement data, the image data and the control programs takes place via the apparatus computer 21. The sequence controller 15 monitors the generation of the respective desired pulse sequences and the corresponding sampling of k-space based on a specification with control programs. In particular, the sequence controller 15 controls the accurately-timed activation of the gradients, the emission of the radio-frequency pulses with defined phase amplitude and the reception of the magnetic resonance signals. The time base for the radio-frequency system 19 and the sequence controller 15 is provided by a synthesizer 26. The selection of corresponding control programs to generate an MR image (which control programs are stored on a DVD 27, for example) and the presentation of the generated MR image take place via a terminal 28 which comprises a keyboard 29, a mouse 30 and a monitor 31.

Figure 2:
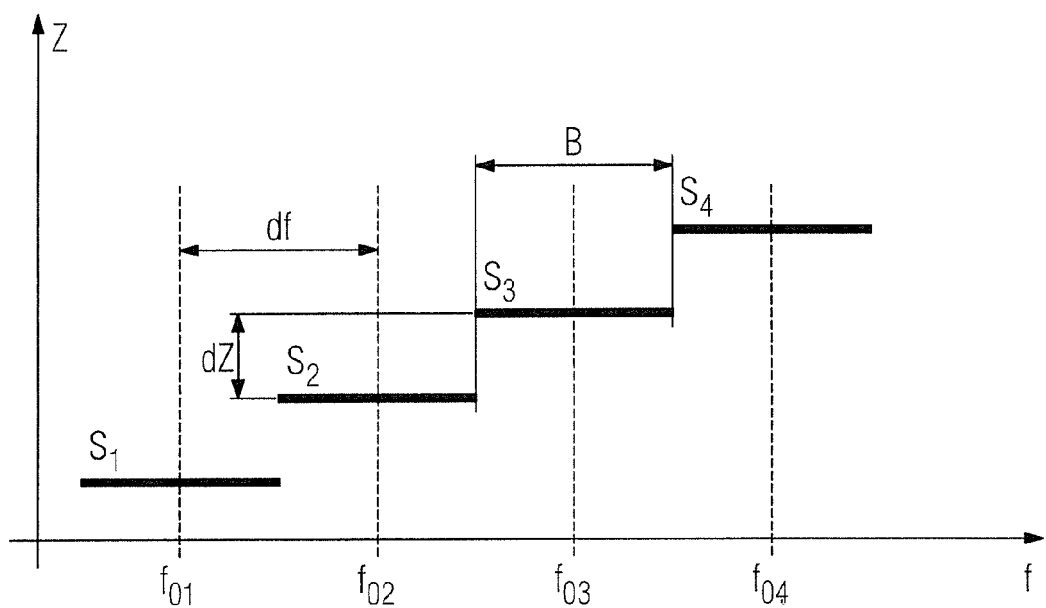
FIG. 2 schematically illustrates the wideband MRI method.

FIG. 2 is a schematic representation of the wideband MRI method. The frequency coding gradient $G_x$ and the slice-selection gradient $G_z$ are active simultaneously upon read-out. This simultaneous activity of two gradients coding the frequency leads to the situation that the signals of all active slices are divided into disjunctive frequency bands with center frequencies $f_{01}$ through $f_{04}$, as well as to the situation that the pixel sensitivity profile is flipped proportional to the ratio of the strengths of the two gradients (thus proportional to $G_z/G_x$). In order to avoid too severe a blurring in the image, the flip angle should not exceed 45°, which means that the slice-selection gradient $G_z$ should not be stronger than the frequency coding gradient $G_x$.

In order to avoid an overlapping of the slices $S_1$ through $S_4$ and alias disruptions in the frequency domain, the slice-selection gradient $G_z$ should also be large enough in order to shift the center resonance frequencies $f_{0i}$ of adjacent slices over a frequency range of the size of at least the frequency band $B_x$, meaning that the condition $G_z dZ > G_x FOV_x$ should be satisfied, wherein $df \sim G_z dZ$ and $dZ \sim G_x FOV_x$.

Figure 3:
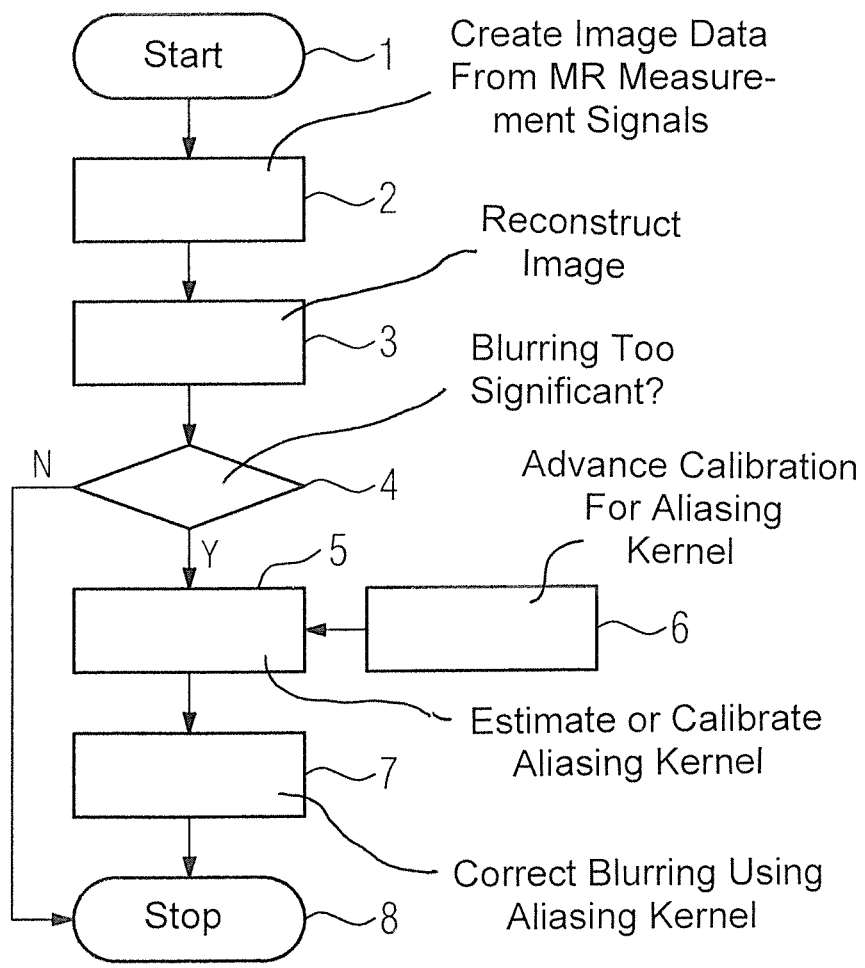
FIG. 3 is a flowchart of an embodiment of the method according to the invention.

FIG. 3 shows a flowchart of a method according to the invention. The scanning process is started in method step 1 and the image data are created from the measurement signals of the magnetic resonance apparatus 9 during method step 2. In method step 3, the image belonging to the image data is reconstructed. This occurs with an image computer 25. The administration of the measurement data, the image data and the control programs takes place via the apparatus computer 21. In method step 4, a query is made to a user as to whether the blurring in the reconstructed image is too significant. If this is not the case (N path), the scanning process is concluded with method step 8. If this is the case (Y path), in method step 5 the aliasing convolution kernel is estimated or calibrated (an advance calibration takes place in method step 6) and the blurring is thus ultimately corrected (method step 6). The scanning process is concluded (method step 8).

Figure 4:
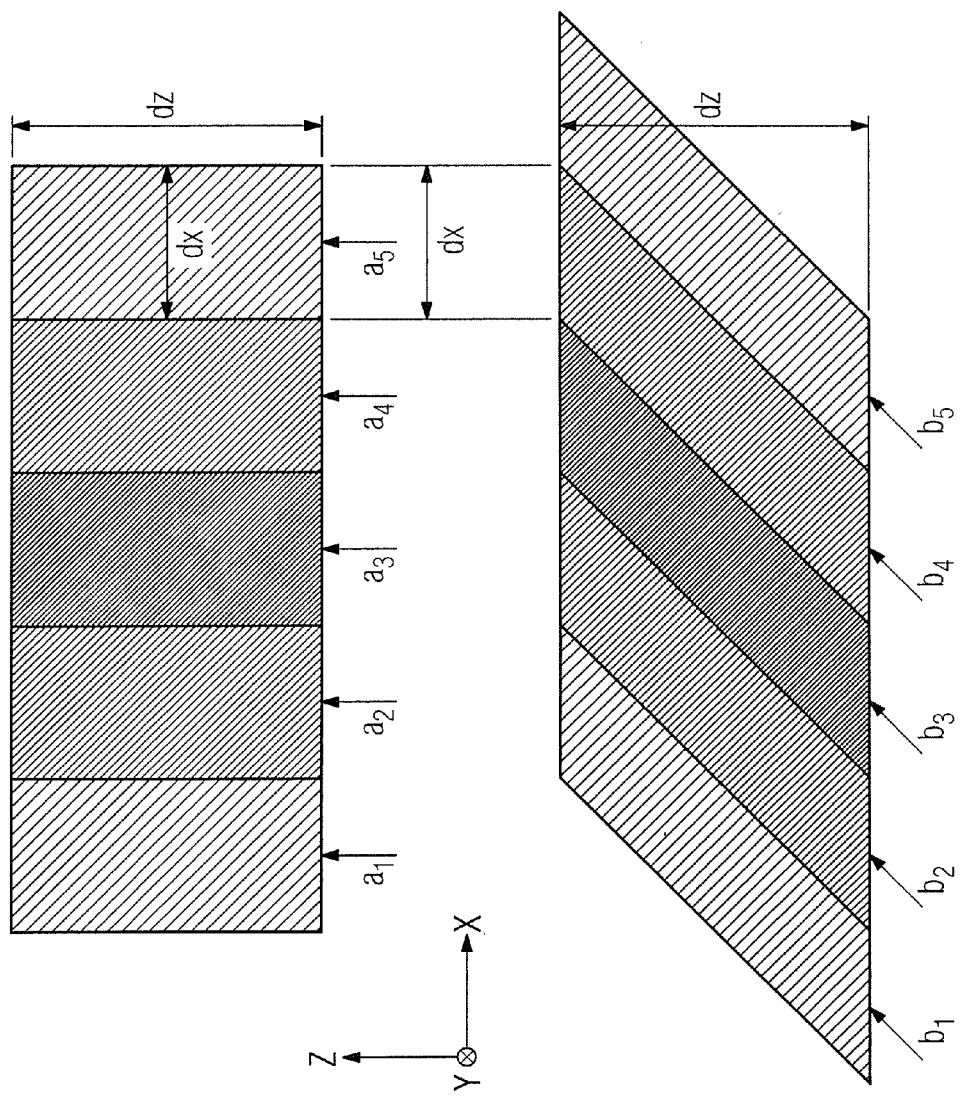
FIG. 4 schematically illustrates an image acquisition from a conventional viewing angle and from a flip angle.

FIG. 4 is a schematic representation of an image acquisition from a conventional viewing angle and from a flip angle. XOY is the plane in which the acquired image lies; dZ is the slice interval that is measured along the Z-axis; the direction of the frequency coding is established along the X-axis.

In the case of image acquisition from a conventional viewing angle, all oscillating spins at the frequency $f_i$ are located in a rectangle or voxel at the position i with the value of the voxel $a_i$ along the X-axis, with the corresponding dimensions dx, dy and dz in all spatial directions.

In the case of image acquisition from a tilted angle, all oscillating spins at the frequency $f_i$ are located in a parallelepiped or tilted voxel at the position i, with the value of the voxel $b_i$ along the X-axis.

FIG. 5 shows an example for calculation of the convolution kernel, i.e. for the calculation of the values of the tilted voxel at the position i with the value $b_i$ along the X-axis depending on the values of the original voxel at the position i with the value $a_i$ along the X-axis. The equation results from an optical projection model. In the present case, for example, the entry for $b_3$ is:

$$b_3 = \frac{a_3 + a_4}{2}$$

The convolution kernel is generally described by $\underline{b}=\underline{K}\underline{a}$, wherein $\underline{b}$ represents the vector of all voxel values $b_i$ in the tilted image and $\underline{a}$ represents the vector of all voxel values $a_i$ in the untilted image. The matrix $\underline{K}$ results from an invariant shift of the aliasing kernel. For the solution to the equation $\underline{a}=\underline{K}^{-1}\underline{b}$, $\underline{K}$ must be inverted. If $\underline{K}$ is poorly conditioned, however, its inverse is unstable, and small disruptions lead to a large error in the solution. Instead of $\underline{K}^{-1}$, in this case the pseudo-inverse matrix $\underline{K}^+$ can be calculated. This can be represented as a Moore-Penrose matrix $\underline{K}^+=(\underline{K}^t\underline{K})^{-1}\underline{K}^t$, for example. Another method to represent $\underline{K}^+$ is Tikhonov regularization with $\underline{K}^+=(\underline{K}^t\underline{K}+\lambda\underline{I})^{-1}\underline{K}^t$. An alternative method is also single value decomposition with $\underline{K}=\underline{U}\text{diag}[\sigma_i]\underline{V}^T, \sigma_k=0, k=1 \ldots \text{def}(\underline{K})$, $$\underline{K}^+ = \underline{V}\text{diag}\left[\frac{1}{\sigma_i}\right]\underline{U}^T, \text{ if } (\sigma_i < \lambda), \text{ then } \left[\frac{1}{\sigma_i}\right] = 0.$$

If a system shows additional noise in the image and/or in the signals, the equation system $\underline{b}_n=\underline{b}+\underline{n}=\underline{K}\underline{a}$ must be solved, wherein $\underline{n}$ is an unknown noise term. For example, this is solved with the L1 norm regularization. $\hat{a}=\arg\min\{\|b_n-Ka\|_2+\beta L1(a)\}$ thereby applies, wherein L1 is the sum of the absolute values and $\beta$ is a regularization term.

FIG. 6 shows a further example for calculation of the convolution kernel, i.e. for the calculation of the values of the tilted voxel at the position i with the value $b_i$ along the X-axis depending on the values of the original voxel at the position i with the value $a_i$ along the X-axis. The equation results from an optical projection model. In the present case, for example, the entry for $b_3$ reads:

$$b_3 = \frac{a_2 + 2a_3 + a_4}{4}$$

FIG. 7 shows a further example for calculation of the convolution kernel, i.e. for the calculation of the values of the tilted voxel at the position i with the value $b_i$ along the X-axis depending on the values of the original voxel at the position i with the value $a_i$ along the X-axis. The equation results from an optical projection model. In the present case, for example, the entry for $b_4$ reads:

$$b_4 = \frac{a_1 + 2a_2 + 2a_3 + 2a_4 + a_5}{8}$$

Figure 8:
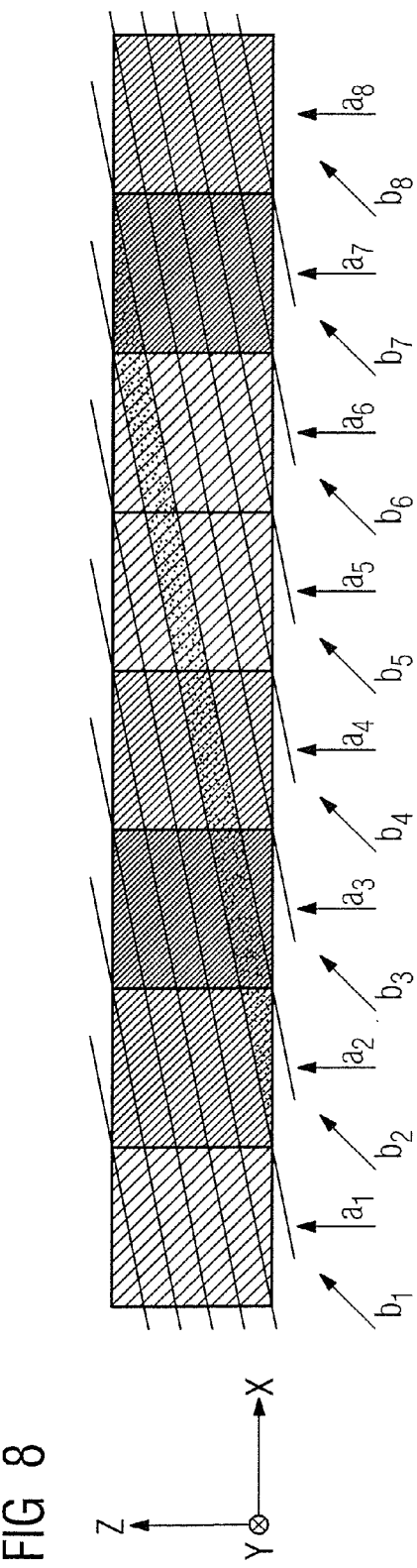
FIG. 8 shows a fourth example for the calculation of a convolution kernel.

FIG. 8 shows a further example for calculation of the convolution kernel, i.e. for the calculation of the values of the tilted voxel at the position i with the value $b_i$ along the X-axis depending on the values of the original voxel at the position i with the value $a_i$ along the X-axis. The equation results from an optical projection model. In the present case, for example, the entry for $b_2$ is:

$$b_2 = \frac{a_2 + 2a_3 + 2a_4 + 2a_5 + 2a_6 + a_7}{10}$$

Figure 9:
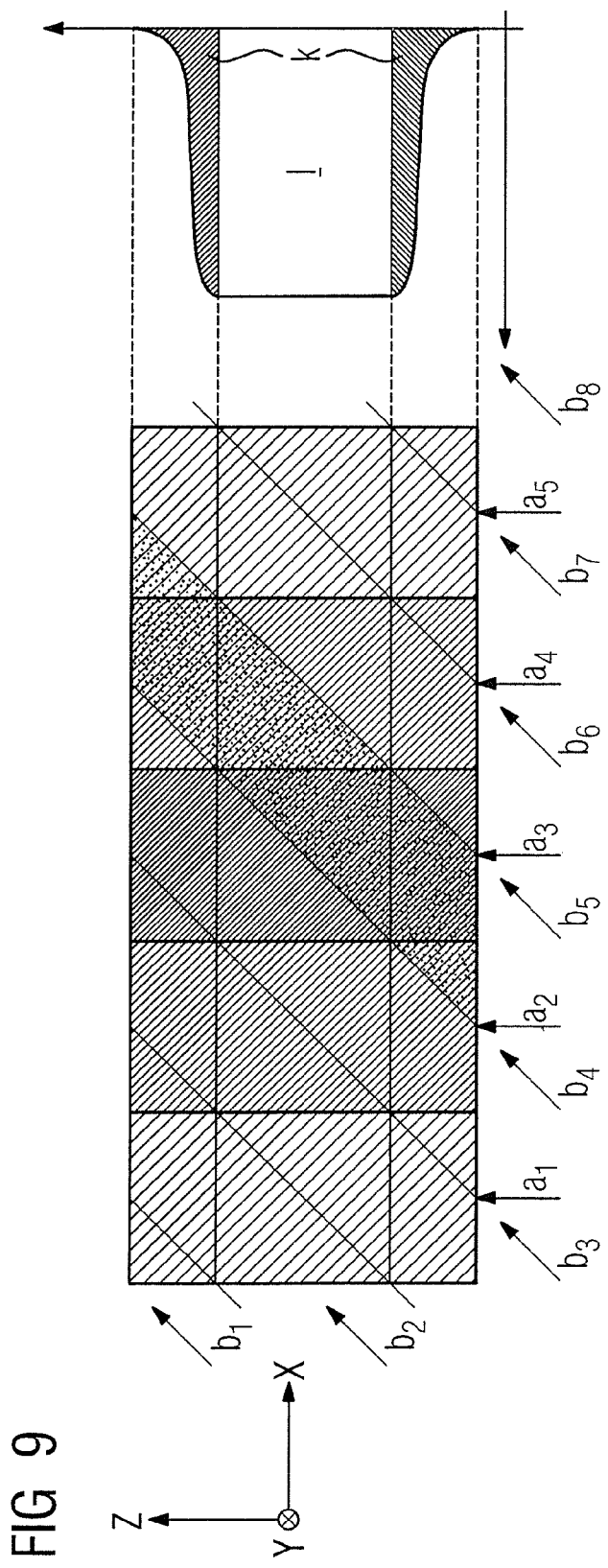
FIG. 9 shows a fifth example for the calculation of a convolution kernel.

FIG. 9 shows a further example for calculation of the convolution kernel, i.e. for the calculation of the values of the tilted voxel at the position i with the value $b_i$ along the X-axis depending on the values of the original voxel at the position i with the value $a_i$ along the X-axis. The equation results from an optical projection model and under consideration of k-contributions of adjacent voxels due to a non-ideal or real slice sensitivity profile. In the present case, for example, the entry for $b_5$ is:

$$b_5 = \frac{\frac{1}{4}ka_2 + \left(\frac{3}{4}k + \frac{1}{2}\right)a_3 + \left(\frac{3}{4}k + \frac{1}{2}\right)a_4 + \frac{1}{4}ka_5}{2k+1}$$

In summary, the invention concerns a method, a magnetic resonance apparatus and a computer-readable storage medium for processing of image data of a magnetic resonance apparatus, wherein, after the reconstruction of the image corresponding to the image data, a description of the degree of the image blurring in the image that results from the acquisition of the image from a tilted angle is implemented. This image blurring is corrected with the use of a convolution kernel.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for processing image data from a magnetic resonance apparatus, comprising:

operating a magnetic resonance apparatus to radiate at least one radio-frequency pulse into at least a region of an examination subject that excites nuclear spins in said region, and acquiring, with view angle tilting, magnetic resonance measurement signals produced by the excited nuclear spins;

supplying the magnetic resonance measurement signals to a computerized processor and, in said processor, executing an image reconstruction algorithm, to reconstruct an image of said region by transforming said magnetic resonance measurement signals into image data, said image data being susceptible to a degree of image blurring due to the acquisition of said magnetic resonance measurement signals with view angle tilting;

providing said processor with an input that represents presence of image blurring;

in said processor, selecting a convolution kernel dependent on said input;

in said processor, automatically applying said convolution kernel to one of said magnetic resonance signals or said image data, thereby deblurring said image; and making the deblurred image available at an output of said processor in electronic form as a data file.

2. A method as claimed in claim 1 comprising using a point spread function to calculate said convolution kernel from said input.

3. A method as claimed in claim 1 comprising controlling operation of said magnetic resonance apparatus to acquire said magnetic resonance measurement signals according to apparatus operating parameters provided to said magnetic resonance apparatus, and calculating said convolution kernel from said input using said parameters.

4. A method as claimed in claim 1 comprising calculating said convolution kernel from said input using a projection model.

5. A method as claimed in claim 1 comprising calculating convolution kernel from said input using a Moore-Penrose matrix.

6. A method as claimed in claim 1 comprising calculating said convolution kernel from said input by Tikhonov regularization.

7. A method as claimed in claim 1 comprising calculating said convolution kernel from said input using a single value decomposition.

8. A method as claimed in claim 1 comprising calculating said convolution kernel from said input using a L1 norm regularization.

9. A method as claimed in claim 1 comprising, before acquiring said magnetic resonance measurement signals operating said magnetic resonance apparatus with a phantom in place of said examination subject and acquiring magnetic resonance calibration measurement signals from said phantom, providing said magnetic resonance calibration measurement signals to said processor as said input representing said degree of image blurring and calculating said convolution kernel using said magnetic resonance calibration measurement signals from said phantom.

10. A method as claimed in claim 1 comprising providing said processor with a further input that pre-populates selected regions of said convolution kernel.

11. A magnetic resonance apparatus comprising:

a magnetic resonance data acquisition unit comprising a radio-frequency signal emitter;

a control computer configured to operate said magnetic resonance acquisition unit to radiate at least one radio-frequency pulse from said radio-frequency signal emitter into at least a region of an examination subject that excites nuclear spins in said region, and to acquire, with view angle tilting, magnetic resonance measurement signals produced by the excited nuclear spins;

a computerized processor supplied with the magnetic resonance measurement signals, said processor being configured to execute an image reconstruction algorithm, to reconstruct an image of said region by transforming said magnetic resonance measurement signals into image data, said image data being susceptible to a degree of image blurring due to the acquisition of said magnetic resonance measurement signals with view angle tilting;

said processor being configured to receive an input that represents presence of image blurring;

in said processor being configured to select a convolution kernel dependent on said input;

said processor being configured to automatically apply said convolution kernel to one of said magnetic resonance signals or said image data, thereby deblurring said image; and said processor being configured to make the deblurred image available at an output of said processor in electronic form as a data file.

12. A non-transitory, computer-readable data storage medium encoded with programming instructions, said storage medium being loaded into a computerized control and evaluation system of a magnetic resonance apparatus that comprises a magnetic resonance data acquisition unit having a radio-frequency signal emitter, said programming instructions causing said computerized control and evaluation unit to:

operate said magnetic resonance data acquisition unit to radiate at least one radio-frequency pulse from said radio-frequency signal emitter into at least a region of an examination subject that excites nuclear spins in said region, and acquire, with view angle tilting magnetic resonance measurement signals produced by the excited nuclear spins;

execute an image reconstruction algorithm, to reconstruct an image of said region by transforming said magnetic resonance measurement signals into image data, said image data being susceptible to a degree of image blurring due to the acquisition of said magnetic resonance measurement signals with view angle tilting;

receive an input that represents presence of image blurring;

select a convolution kernel dependent on said input;

automatically apply said convolution kernel to one of said magnetic resonance signals or said image data, thereby deblurring said image; and make the deblurred image available at an output of said control and evaluation system in electronic form as a data file.

* * * * *